(12) United States Patent
Oishi et al.

(10) Patent No.: US 6,812,766 B2
(45) Date of Patent: Nov. 2, 2004

(54) INPUT/OUTPUT CIRCUIT OF SEMICONDUCTOR INTEGRATED CIRCUIT

(75) Inventors: Hideo Oishi, Osaka (JP); Tadayoshi Seike, Osaka (JP); Masanori Hirofuji, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/151,949

(22) Filed: May 22, 2002

(65) Prior Publication Data

US 2002/0175734 A1 Nov. 28, 2002

(30) Foreign Application Priority Data

May 22, 2001 (JP) ........................................ 2001-152156

(51) Int. Cl.[7] .............................................. H03K 5/08
(52) U.S. Cl. ........................ 327/309; 327/318; 327/321; 327/328
(58) Field of Search ................................ 327/309, 306, 327/318, 319, 321, 327, 328, 427, 566; 257/23, 24, 213, 235, 296, 298, 355–357, 84, 245; 326/81, 83, 86; 361/90, 91.1, 91.5

(56) References Cited

U.S. PATENT DOCUMENTS

| | | | | |
|---|---|---|---|---|
| 4,789,917 A | * | 12/1988 | Miller .......................... | 361/56 |
| 5,191,244 A | * | 3/1993 | Runaldue et al. ............. | 326/86 |
| 5,300,835 A | * | 4/1994 | Assar et al. ................... | 326/68 |
| 5,422,591 A | * | 6/1995 | Rastegar et al. .............. | 327/409 |
| 5,543,733 A | * | 8/1996 | Mattos et al. ................. | 326/81 |
| 5,880,602 A | * | 3/1999 | Kaminaga et al. ............ | 326/81 |
| 6,184,557 B1 | * | 2/2001 | Poplevine et al. ........... | 257/358 |
| 6,225,846 B1 | * | 5/2001 | Wada et al. ................. | 327/215 |
| 6,232,827 B1 | * | 5/2001 | De et al. ...................... | 327/537 |
| 6,265,926 B1 | * | 7/2001 | Wong .......................... | 327/318 |
| 6,320,415 B1 | * | 11/2001 | Lee .............................. | 326/81 |
| 6,414,360 B1 | * | 7/2002 | Gardner ....................... | 257/369 |
| 6,469,568 B2 | * | 10/2002 | Toyoyama et al. .......... | 327/534 |
| 6,496,054 B1 | * | 12/2002 | Prather et al. ............... | 327/534 |

FOREIGN PATENT DOCUMENTS

| | | |
|---|---|---|
| JP | 52-57785 | 5/1977 |
| JP | 53-121583 | 10/1978 |
| JP | 63-164258 | 7/1988 |
| JP | 2-246265 | 10/1990 |
| JP | 4-70008 | 3/1992 |
| JP | 4-328858 | 11/1992 |
| JP | 6-216346 | 8/1994 |
| JP | 8-330427 | 12/1996 |
| JP | 5-335504 | 12/1997 |

* cited by examiner

*Primary Examiner*—Timothy P. Callahan
*Assistant Examiner*—Hai L. Nguyen
(74) *Attorney, Agent, or Firm*—McDermott Will & Emery LLP

(57) ABSTRACT

The input/output circuit of the present invention includes a first p-channel transistor and a charge drawing circuit. The first p-channel transistor is connected to an input/output pad of the semiconductor integrated circuit. The charge drawing circuit, driven with a control signal, draws a charge from an n-well diffusion region of the p-channel transistor during output. By the charge drawing, the potential at the n-well diffusion region of the p-channel transistor is kept at the supply voltage during output, and thus the input/output circuit is prevented from deterioration in current flow capability due to a back bias effect.

14 Claims, 11 Drawing Sheets

US 6,812,766 B2

INPUT/OUTPUT CIRCUIT OF SEMICONDUCTOR INTEGRATED CIRCUIT

BACKGROUND OF THE INVENTION

The present invention relates to an input/output circuit, and more particularly, to an input/output circuit of a field effect semiconductor integrated circuit, for inputting/outputting signals from/to the outside of the semiconductor integrated circuit.

With the recent high integration of semiconductor devices, high performance has been increasingly demanded in the technology of input/output circuits for inputting/outputting signals from/to the outside of the devices. In particular, while the voltage of external input/output signals remains at the conventional TTL level, the supply voltage internal to a semiconductor integrated circuit is required to be lower as the size of the semiconductor integrated circuit is made finer. In view of this, it is required to provide an input/output circuit capable of accepting a voltage higher than the supply voltage internal to a semiconductor integrated circuit. In realization of such an input/output circuit, a problem arises in a p-channel transistor of the output part of the input/output circuit. That is, in a normal configuration, the supply voltage is applied to an n-well region of the p-channel transistor of the output part. The drain of the p-channel transistor is a p-type diffusion region. Therefore, when a voltage higher than the supply voltage is applied to the drain, a forward bias is applied to the PN junction causing flow of a large current, and this may possibly destroy the semiconductor integrated circuit. Thus, a unique construction is necessary for an input/output circuit capable of accepting a voltage higher than the supply voltage internal to the semiconductor integrated circuit.

FIG. 11 illustrates an input/output circuit capable of accepting a voltage higher than the supply voltage internal to the semiconductor integrated circuit, as first related art. In FIG. 11, for simplification of description, only a p-channel transistor B02 of an output part is shown, omitting an input part and an n-channel transistor of the output part. The p-channel transistor B02 includes a source diffusion region B02$a$, a gate B02$b$, a drain diffusion region B02$c$, an n-well diffusion region B02$d$, a substrate B02$e$ and device isolators B02$g$ and B02$h$. The input/output of signals into/from a semiconductor integrated circuit having the input/output circuit shown in FIG. 11 is entirely performed via an input/output pad B03. The supply voltage VDD (V) is applied to the source diffusion region B02$a$. Therefore, in the initial state, the voltage at the n-well diffusion region B02$d$ is as high as VDD (V) due to the PN junction with the source diffusion region B02$a$.

The operation of the input/output circuit with the above configuration is as follows. Herein, the case that a voltage is applied from outside when the input/output circuit is in the input state is described. When an input at a voltage VH (V) higher than the supply voltage is applied to the input/output pad B03, the potential at the n-well diffusion region B02$d$ rises to as high as VH (V) due to the PN junction with the drain diffusion region B02$c$. A current flows into the input/output pad B03 during the charging of the n-well diffusion region B02$d$ to VH (V). However, the current flow stops once the voltage at the n-well diffusion region B02$d$ reaches VH (V). Also, at this time, a reverse voltage is applied to the PN junction between the n-well diffusion region B02$d$ and the source diffusion region B02$a$. Therefore, no large current will flow between the n-well diffusion region B02$d$ and the source diffusion region B02$a$. Accordingly, using the input/output circuit shown in FIG. 11, the semiconductor integrated circuit is prevented from destruction even when a voltage higher than the supply voltage internal to the semiconductor integrated circuit is input into the semiconductor integrated circuit.

The input/output circuit shown in FIG. 11 does not accept a voltage lower than the ground voltage due to the existence of the n-channel transistor (not shown) of the output part. An input/output circuit capable of accepting a voltage lower than the ground voltage is realized by a diffusion method separating a p-well. FIG. 12 illustrates a conventional input/output circuit capable of accepting a voltage lower than the ground voltage, as second related art. In FIG. 12, for simplification of description, only an n-channel transistor C02 of an output part is shown, omitting an input part and a p-channel transistor of the output part. The n-channel transistor C02 includes a source diffusion region C02$a$, a gate C02$b$, a drain diffusion region C02$c$, a p-well diffusion region C02$d$, a substrate C02$e$ and device isolators C02$g$ and C02$h$. The input/output of signals into/from a semiconductor integrated circuit (LSI) having the input/output circuit shown in FIG. 12 is entirely performed via an input/output pad C03. The source diffusion region C02$a$ is grounded. Therefore, in the initial state, the potential at the p-well diffusion region C02$d$ is as low as the ground voltage due to the PN junction with the source diffusion region C02$a$.

The operation of the input/output circuit with the above configuration is as follows. Herein, the case that a voltage is applied from outside when the input/output circuit is in the input state is described. When an input signal at a voltage VL (V) lower than the ground voltage is applied to the input/output pad C03, the voltage at the p-well diffusion region C02$d$ drops to as low as VL (V) due to the PN junction with the drain diffusion region C02$c$. A current flows from the input/output pad C03 during the discharging of the p-well diffusion region C02$d$ to VL (V). However, the current flow stops once the potential at the p-well diffusion region C02$d$ reaches VL (V). Also, at this time, a reverse voltage is applied to the PN junction between the p-well diffusion region C02$d$ and the source diffusion region C02$a$. Therefore, no large current will flow between the p-well diffusion region C02$d$ and the source diffusion region C02$a$. Accordingly, using the conventional input/output circuit shown in FIG. 12, the LSI is prevented from destruction even when a voltage lower than the ground voltage is input into the LSI.

However, the related art described above has the following problems. In the input/output circuit shown in FIG. 11, after a voltage higher than the supply voltage is applied during input, the potential at the n-well diffusion region B02$d$ of the p-channel transistor B02 is higher than the supply voltage during output. This deteriorates the current flow capability due to a back bias effect.

In the input/output circuit shown in FIG. 12, after a voltage lower than the ground voltage is applied during input, the potential at the p-well diffusion region C02$d$ of the n-channel transistor C02 is lower than the ground voltage during output. This deteriorates the current flow capability due to the back bias effect.

SUMMARY OF THE INVENTION

An object of the present invention is providing an input/output circuit capable of preventing deterioration in current flow capability due to the back bias effect.

According to one aspect of the present invention, the input/output circuit is an input/output circuit of a semiconductor integrated circuit, including a first p-channel transistor and a charge drawing circuit. The first p-channel transistor is connected to an input/output pad of the semiconductor integrated circuit. The charge drawing circuit draws a charge from an n-well diffusion region of the first p-channel transistor.

According to another aspect of the invention, the input/output circuit is an input/output circuit of a semiconductor integrated circuit, including a first n-channel transistor and a charge drawing circuit. The first n-channel transistor is connected to an input/output pad of the semiconductor integrated circuit. The charge drawing circuit draws a charge from a p-well diffusion region of the first n-channel transistor.

The input/output circuit described above includes the charge drawing circuit. Therefore, deterioration in current flow capability due to the back bias effect is prevented.

According to yet another aspect of the invention, the input/output circuit is an input/output circuit for outputting a signal from an internal circuit of a semiconductor integrated circuit to an input/output pad of the semiconductor integrated circuit, including a first p-channel transistor and a charge drawing circuit. The first p-channel transistor is connected between a power supply node receiving a supply voltage internal to the semiconductor integrated circuit and the input/output pad. The gate of the first p-channel transistor receives a signal from an internal circuit of the semiconductor integrated circuit directly or indirectly. The charge drawing circuit draws a charge from an n-well diffusion region of the first p-channel transistor to a ground node receiving a ground voltage when the input/output circuit outputs the signal from the internal circuit to the input/output pad.

Preferably, the charge drawing circuit includes a first n-channel transistor and a second n-channel transistor. The first n-channel transistor is connected between the n-well diffusion region of the first p-channel transistor and a first node, and is turned ON when the input/output circuit outputs the signal from the internal circuit to the input/output pad. The second n-channel transistor is connected between the first node and the ground node, and is turned OFF when the input/output circuit outputs the signal from the internal circuit to the input/output pad.

In the input/output circuit described above, the potential at the n-well diffusion region of the first p-channel transistor is kept at the internal supply voltage level when the input/output circuit outputs the signal from the internal circuit to the input/output pad. Therefore, deterioration in current flow capability due to the back bias effect of the first p-channel transistor is prevented.

According to still another aspect of the invention, the input/output circuit is an input/output circuit for outputting a signal from an internal circuit of a semiconductor integrated circuit to an input/output pad of the semiconductor integrated circuit, including a first n-channel transistor and a charge drawing circuit. The first n-channel transistor is connected between a ground node receiving a ground voltage and the input/output pad. The gate of the first n-channel transistor receives a signal from an internal circuit of the semiconductor integrated circuit directly or indirectly. The charge drawing circuit draws a charge from a p-well diffusion region of the first n-channel transistor to a power supply node receiving a supply voltage internal to the semiconductor integrated circuit when the input/output circuit outputs the signal from the internal circuit to the input/output pad.

Preferably, the charge drawing circuit includes a first p-channel transistor and a second p-channel transistor. The first p-channel transistor is connected between the p-well diffusion region of the first n-channel transistor and a first node, and is turned ON when the input/output circuit outputs the signal from the internal circuit to the input/output pad. The second p-channel transistor is connected between the first node and the power supply node, and is turned OFF when the input/output circuit outputs the signal from the internal circuit to the input/output pad.

In the input/output circuit described above, the potential at the p-well diffusion region of the first n-channel transistor is kept at the ground voltage level when the input/output circuit outputs the signal from the internal circuit to the input/output pad. Therefore, deterioration in current flow capability due to the back bias effect of the first n-channel transistor is prevented.

DESCRIPTION OF THE PREFERRED EMBODIMENTS

Hereinafter, preferred embodiments of the present invention will be described with reference to the accompanying drawings.

Embodiment 1

An input/output circuit of Embodiment 1 of the present invention, placed inside a semiconductor integrated circuit (LSI), includes an input part and an output part. The input part receives a signal from the outside of the LSI and passes the signal to an internal circuit of the LSI. The output part receives a signal from an internal circuit of the LSI and outputs the signal to the outside of the LSI.

Figure 1:
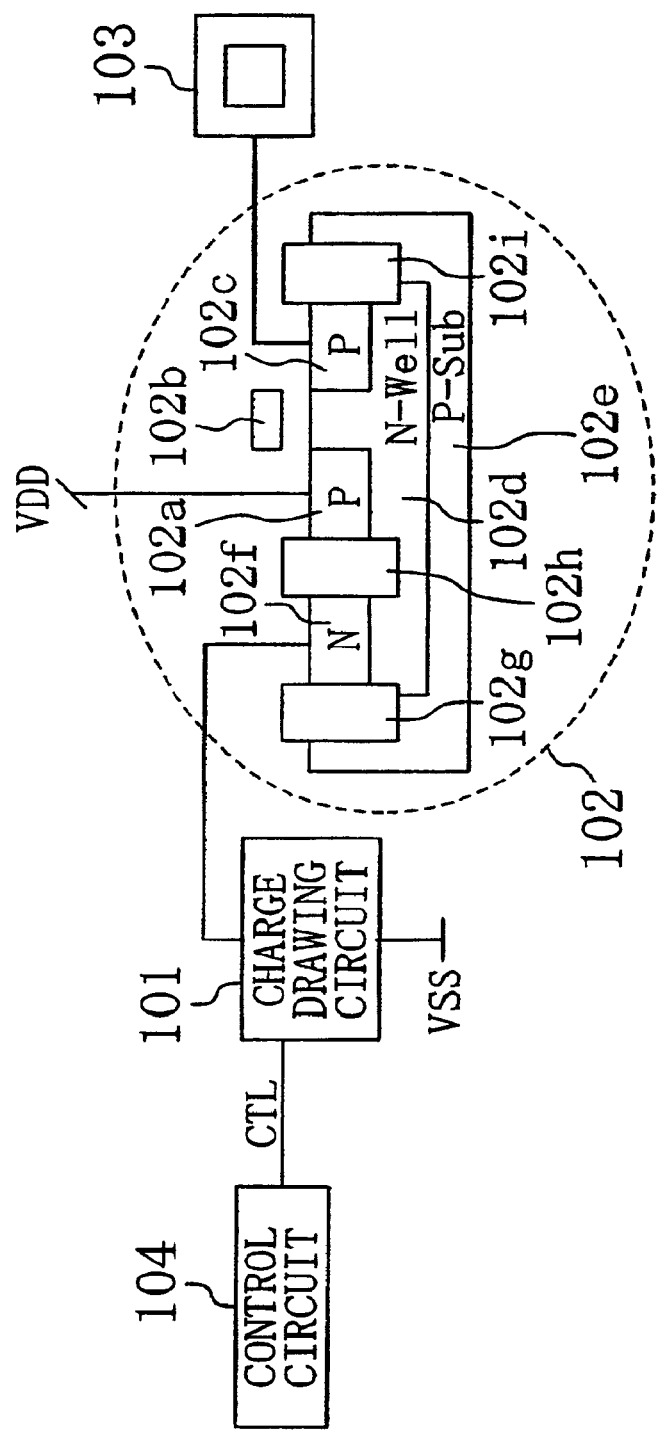
FIG. 1 is an illustration of an output part of an input/output circuit of Embodiment 1 of the present invention.

FIG. 1 illustrates the output part of the input/output circuit of Embodiment 1. Referring to FIG. 1, the output part includes a p-channel transistor 102, a charge drawing circuit 101 and a control circuit 104. The p-channel transistor 102 includes a source diffusion region 102a, a gate 102b, a drain diffusion region 102c, an n-well diffusion region 102d, a substrate 102e, an n-diffusion region 102f and device isolators 102g, 102h and 102i. The control circuit 104 outputs a low (L) level (ground voltage level) control signal CTL when the input/output circuit is in the output state and outputs a high (H) level (supply voltage level) control signal CTL when the input/output circuit is in the input state. The charge drawing circuit 101 draws a charge from the n-well diffusion region 102*d* to a ground node via the n-diffusion region 102*f* when the control signal CTL is at the L level, and does not draw a charge when the control signal CTL is at the H level. The ground node receives the ground voltage VSS.

For simplification of description, the input part and an n-channel transistor of the output part are omitted in FIG. 1. A signal to be output externally is supplied to the gates of the p-channel transistor 102 and the n-channel transistor directly or indirectly from an internal circuit of the LSI.

The input/output of signals into/from the LSI having the input/output circuit shown in FIG. 1 is entirely performed via an input/output pad 103.

The supply voltage VDD (V) internal to the LSI is applied to the source diffusion region 102*a*. Therefore, in the initial state, the potential at the n-well diffusion region 102*d* is as high as VDD (V) due to the PN junction with the source diffusion region 102*a*.

Hereinafter, the operation of the input/output circuit having the above configuration will be described.

First, the case that the input/output circuit is in the input state (a signal from the outside of the LSI is input into an internal circuit of the LSI) will be described.

In the input state, the control circuit 104 outputs the H-level control signal CTL. Receiving the H-level control signal CTL, the charge drawing circuit 101 does not draw a charge. Therefore, the n-well diffusion region 102*d* is isolated from the ground node. In this state, when a signal at a voltage VH (V) higher than the supply voltage is input into the input/output pad 103, the potential at the n-well diffusion region 102*d* rises to as high as VH (V) due to the PN junction with the drain diffusion region 102*c*. A current flows into the input/output pad 103 during the charging of the n-well diffusion region 102*d* to VH (V). However, the current flow stops once the voltage at the n-well diffusion region 102*d* reaches VH (V). Also, at this time, a reverse voltage is applied to the PN junction between the n-well diffusion region 102*d* and the source diffusion region 102*a*. Therefore, no large current will flow between the n-well diffusion region 102*d* and the source diffusion region 102*a*. Accordingly, the LSI having the input/output circuit shown in FIG. 1 is prevented from destruction even when a voltage higher than the supply voltage internal to the LSI is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level control signal CTL, the charge drawing circuit 101 draws a charge from the n-well diffusion region 102*d* via the n-diffusion region 102*f*. Thus, a charge accumulated in the n-well diffusion region 102*d* is drawn to the ground node. The potential at the n-well diffusion region 102*d* therefore drops and once it is lower than the supply voltage VDD (V), it resumes the supply voltage VDD (V) due to the PN junction with the source diffusion region 102*a*. In this way, in the output state, the n-well diffusion region 102*d* always resumes the voltage VDD (V). Accordingly, it is possible to prevent deterioration in current flow capability due to the back bias effect of the p-channel transistor 102 of the output part.

It is important to draw a charge to the ground node because if a charge having a potential higher than the supply voltage is drawn to a power supply node, the p-channel transistor connected to a power supply line may possibly cause latch-up.

Embodiment 2

Figure 2:
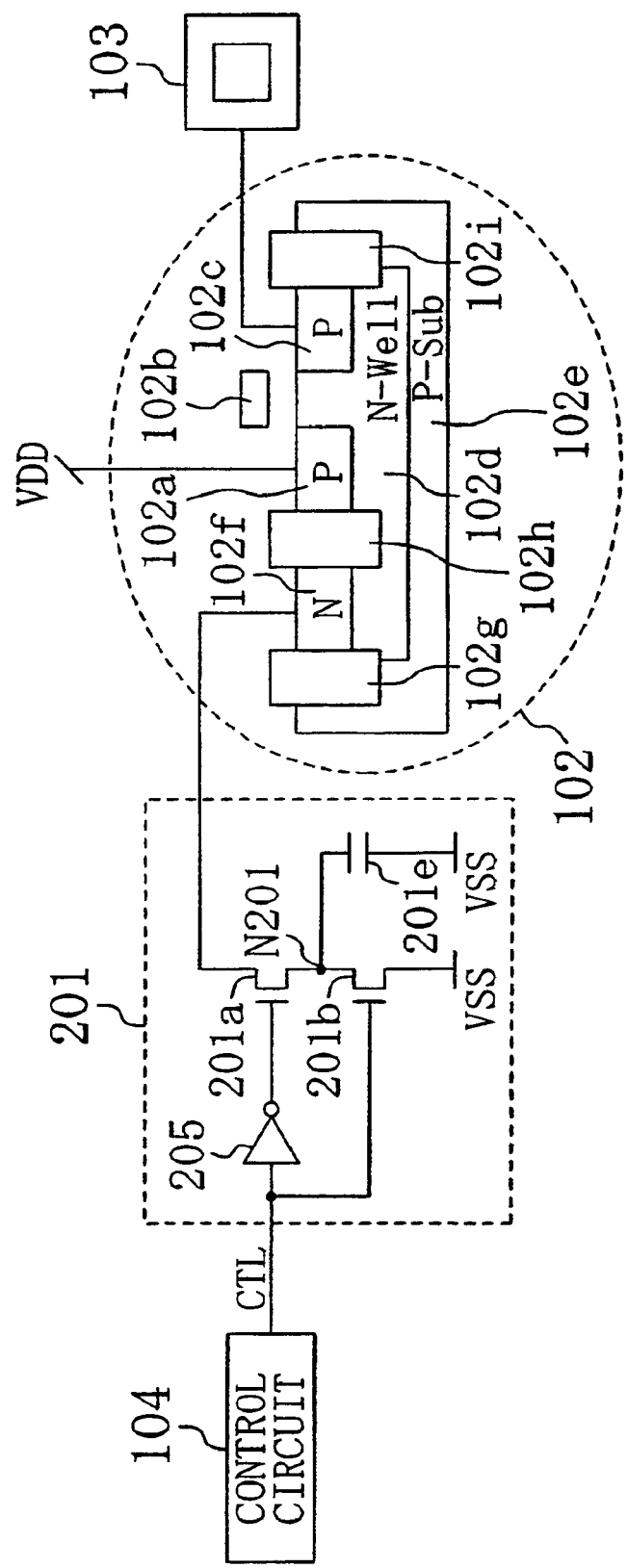
FIG. 2 is an illustration of an output part of an input/output circuit of Embodiment 2 of the present invention.

The input/output circuit of Embodiment 2 of the present invention includes a charge drawing circuit 201 shown in FIG. 2 in place of the charge drawing circuit 101 shown in FIG. 1. The other components of the input/output circuit are the same as those of the input/output circuit of Embodiment 1. FIG. 2 illustrates an output part of the input/output circuit of Embodiment 2. Referring to FIG. 2, the charge drawing circuit 201 includes an inverter circuit 205, n-channel transistors 201*a* and 201*b* and a capacitance 201*e*. The inverter circuit 205 inverts the control signal CTL from the control circuit 104. The n-channel transistor 201*a*, connected between the n-diffusion region 102*f* of the p-channel transistor 102 and a node N201, receives the output of the inverter circuit 205 at its gate. The n-channel transistor 201*b*, connected between the node N201 and a ground node, receives the control signal CTL from the control circuit 104 at its gate. The capacitance 201*e* is connected between the node N201 and a ground node in parallel with the n-channel transistor 201*b*.

Hereinafter, the operation of the input/output circuit with the above configuration will be described.

First, the case that the input/output circuit is in the input state (a signal from the outside of the LSI is input into an internal circuit of the LSI) will be described.

In the input state, the control circuit 104 outputs the H-level control signal CTL. Receiving the H-level signal, the inverter circuit 205 outputs an L-level signal. This turns the n-channel transistor 201*b* ON and the n-channel transistor 201*a* OFF. Therefore, the potential at the node N201 becomes the L level, and the capacitance 201*e* is charged to the ground voltage. As a result, the charge drawing circuit 201 does not draw a charge, and thus the n-well diffusion region 102*d* of the p-channel transistor 102 is isolated from the ground node. In this state, when a signal at a voltage VH (V) higher than the supply voltage is input into the input/output pad 103, the voltage at n-well diffusion region 102*d* rises to as high as VH (V) due to the PN junction with the drain diffusion region 102*c*. A current flows into the input/output pad 103 during the charging of the n-well diffusion region 102*d* to VH (V). However, the current flow stops once the voltage at the n-well diffusion region 102*d* reaches VH (V). Also, at this time, a reverse voltage is applied to the PN junction between the n-well diffusion region 102*d* and the source diffusion region 102*a*. Therefore, no large current will flow between the n-well diffusion region 102*d* and the source diffusion region 102*a*. Accordingly, the LSI having the input/output circuit shown in FIG. 2 is prevented from destruction even when a voltage higher than the supply voltage internal to the LSI is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level control signal CTL, the inverter circuit 205 outputs an H-level signal. This turns the n-channel transistor 201*b* OFF and the n-channel transistor 201*a* ON, and thus the node N201 and the n-well diffusion region 102*d* are electrically connected via the n-channel transistor 201*a*. Suppose the diffusion parasitic capacitance values of the n-channel transistors 201*a* and 201*b* connected to the node N201 are C201*a* (F) and C201*b* (F), respectively, the capacitance value of the capacitance 201*e* is C201*e* (F), and the parasitic capacitance value of the n-well diffusion region 102d of the p-channel transistor is C102d (F). The potential Vlast (V) at the n-well diffusion region 102d after the connection is calculated as follows, under the assumption that the n-channel transistor 201a remains ON until the final state.

$$Vlast=C102d/(C201a+C201b+C201e+C102d)\times VH \quad \text{Expression (1)}$$

The condition under which the n-channel transistor 201a remains ON until the final state is as follows.

$$(VH-VDD+Vtn)/(VDD-Vth)\times C102d<C201a+C201b+C201e \quad \text{Expression (2)}$$

wherein Vth is the threshold voltage of the n-channel transistor 201a. Assume that C201a+C201b+C201e satisfies the above condition. Normally, C102d is a comparatively small value. Therefore, if the condition of Expression (2) is satisfied only with C201a and C201b, the capacitance 201e in FIG. 2 is unnecessary. Under the above assumption, the Vlast (V) satisfies the following.

$$Vlast<VDD-Vtn \quad \text{Expression (3)}$$

As described above, the potential at the n-well diffusion region 102d drops below VDD (V). The potential at the n-well diffusion region 102d that has dropped then rises to VDD (V) due to the PN junction with the source diffusion region 102a. In this way, in the output state, the n-well diffusion region 102d always resumes the voltage VDD (V). Accordingly, it is possible to prevent deterioration in current flow capability due to the back bias effect of the p-channel transistor 102 of the output part.

Embodiment 3

In the input/output circuit of Embodiment 2, the node N201 of the charge drawing circuit 201 is at the L level (ground voltage level) in the input state. Therefore, when the state is switched to the output state, part of the n-well diffusion region 102d of the p-channel transistor 102 may possibly be at the ground voltage momentarily, and this may easily cause latch-up. Embodiment 3 aims to overcome this problem.

Figure 3:
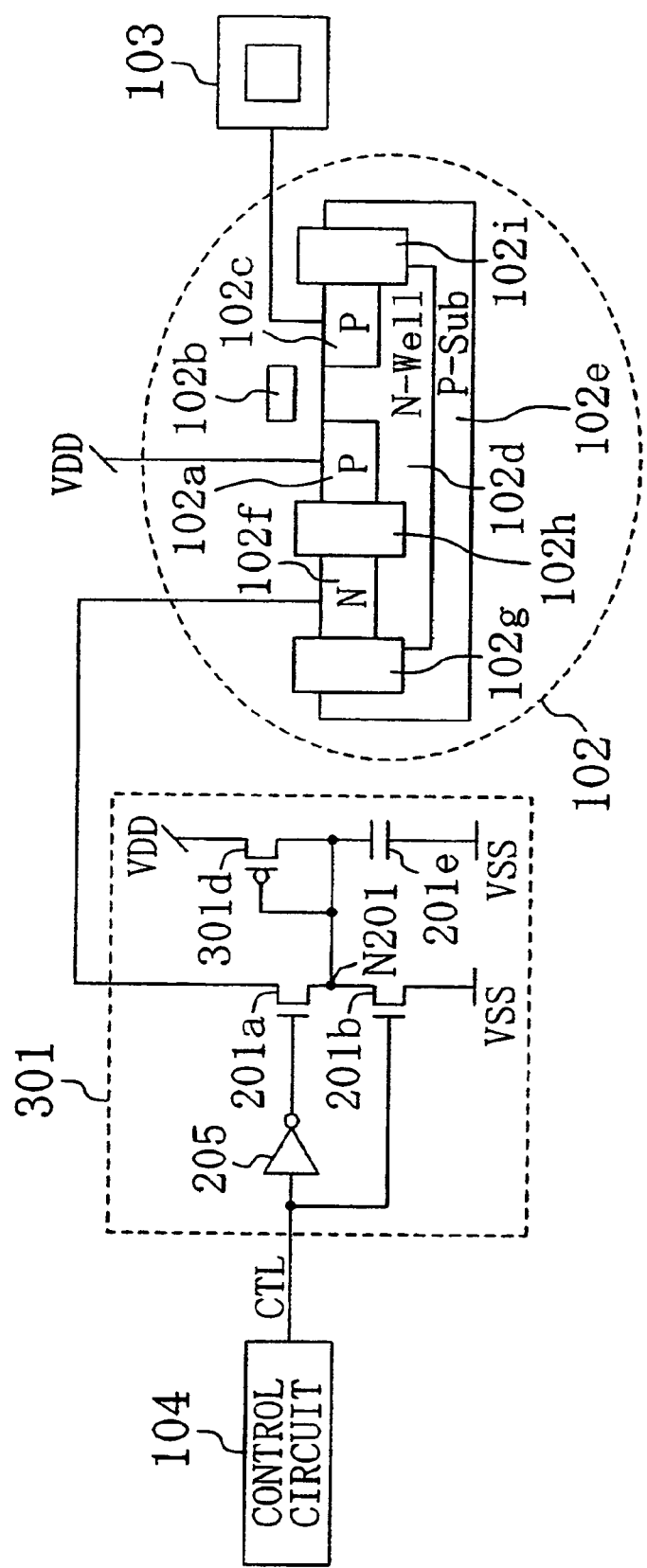
FIG. 3 is an illustration of an output part of an input/output circuit of Embodiment 3 of the present invention.

The input/output circuit of Embodiment 3 of the present invention includes a charge drawing circuit 301 shown in FIG. 3 in place of the charge drawing circuit 201 shown in FIG. 2. The other components of the input/output circuit are the same as those of the input/output circuit of Embodiment 2. FIG. 3 illustrates an output part of the input/output circuit of Embodiment 3. Referring to FIG. 3, the charge drawing circuit 301 includes the inverter circuit 205, the n-channel transistors 201a and 201b, the capacitance 201e and a p-channel transistor 301d. The p-channel transistor 301d is connected between a power supply node receiving the supply voltage VDD and the node N201, and receives a voltage at the node N201 at its gate. Assume that the threshold voltage Vtp (V) of the p-channel transistor 301d and the threshold voltage Vtn (V) of the n-channel transistor 201a have the following relationship.

$$|Vtp|>Vtn \quad \text{Expression (4)}$$

Hereinafter, the operation of the input/output circuit with the above configuration will be described.

First, the case that the input/output circuit is in the input state (a signal from the outside of the LSI is input into an internal circuit of the LSI) will be described.

In the input state, the control circuit 104 outputs the H-level control signal CTL. Receiving the H-level control signal, the inverter circuit 205 outputs an L-level signal. This turns the n-channel transistor 201b ON and the n-channel transistor 201a OFF. Therefore, the node N201 becomes the L level, and thus the p-channel transistor 301d is turned ON. With the p-channel transistor 301d being turned ON, the potential at the node N201 rises. Finally, the p-channel transistor 301d is turned OFF when the voltage at the node N201 reaches VDD-|Vtp|. Therefore, the charge drawing circuit 301 does not draw a charge, and thus the n-well diffusion region 102d of the p-channel transistor 102 is isolated from the ground node. In this state, when a signal at a voltage VH (V) higher than the supply voltage is input into the input/output pad 103, the potential at the n-well diffusion region 102d rises to as high as VH (V) due to the PN junction with the drain diffusion region 102c. A current flows into the input/output pad 103 during the charging of the n-well diffusion region 102d to VH (V). However, the current flow stops once the voltage at the n-well diffusion region 102d reaches VH (V). Also, at this time, a reverse voltage is applied to the PN junction between the n-well diffusion region 102d and the source diffusion region 102a, and thus, no large current will flow between the n-well diffusion region 102d and the source diffusion region 102a. Accordingly, the LSI having the input/output circuit shown in FIG. 3 is prevented from destruction even when a voltage higher than the supply voltage internal to the LSI is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level signal, the inverter circuit 205 outputs an H-level signal. This turns the n-channel transistor 201b OFF. As for the n-channel transistor 201a, since the gate potential is VDD (V) and the source potential is VDD-|Vtp|, the gate-source voltage is |Vtp|. From the condition of Expression (4) above, the n-channel transistor 201a is turned ON, and the p-channel transistor 301d is turned OFF. Thus, the node N201 of the charge drawing circuit 301 and the n-well diffusion region 102d of the p-channel transistor 102 are electrically connected via the n-channel transistor 201a. Suppose the diffusion parasitic capacitance values of the n-channel transistors 201a and 201b connected to the node N201 are C201a (F) and C201b (F), respectively, the sum of the diffusion parasitic capacitance value and the gate parasitic capacitance value of the p-channel transistor 301d connected to the node N201 is C301d (F), the capacitance value of the capacitance 201e is C201e (F), the parasitic capacitance value of the n-well diffusion region 102d of the p-channel transistor 102 is C102d (F), and the total capacitance value Call (F) is as follows.

$$Call=C201a+C201b+C301d+C201e+C102d \quad \text{Expression (5)}$$

The potential Vlast (V) at the n-well diffusion region 102d after the connection is calculated as follows, under the assumption that the n-channel transistor 201a remains ON until the final state.

$$Vlast=((Call-C102d)\times(VDD-|Vtp|)+C102d\times VH)/Call \quad \text{Expression (6)}$$

The condition under which the n-channel transistor 201a remains ON until the final state is as follows.

$$(VH-VDD+Vtn)/(|Vtp|-Vtn)\times C102d<C201a+C201b+C301d+C201e \quad \text{Expression (7)}$$

Assume that C201a+C201b+C301d+C201e satisfies the above condition. Normally, C102d is a comparatively small value. Therefore, if the condition of Expression (7) is satisfied only with C201a, C201b and C301d, the capacitance 201e in FIG. 3 is unnecessary. Under the above assumption, the Vlast (V) satisfies the following.

$$Vlast<VDD-Vtn \qquad \text{Expression (8)}$$

As described above, the potential at the n-well diffusion region 102d drops below VDD (V). The potential at the n-well diffusion region 102d that has dropped then rises to VDD (V) due to the PN junction with the source diffusion region 102a. In this way, in the output state, the n-well diffusion region 102d always resumes the voltage VDD (V). Accordingly, it is possible to prevent deterioration in current flow capability due to the back bias effect of the p-channel transistor 102 of the output part.

In the input state, the node N201 is at a potential higher than the ground voltage. Therefore, a potential higher than the ground voltage is applied to the n-well diffusion region 102d when the state is switched to the output state. Thus, latch-up will not easily occur.

Due to the existence of the inverter circuit 205, the n-channel transistors 201a and 201b may momentarily be turned ON simultaneously when the state is switched from the output state to the input state. In such an event, however, the potential at the n-well diffusion region 102d is prevented from dropping to VDD−|Vtp| or lower due to the charging by the p-channel transistor 301d. This suppresses occurrence of latch-up.

Embodiment 4

In the input/output circuit of Embodiment 3, a through current flows along the route of the power supply node—the p-channel transistor 301d—the n-channel transistor 201b—the ground node in the input state. Embodiment 3 aims to overcome this problem.

Figure 4:
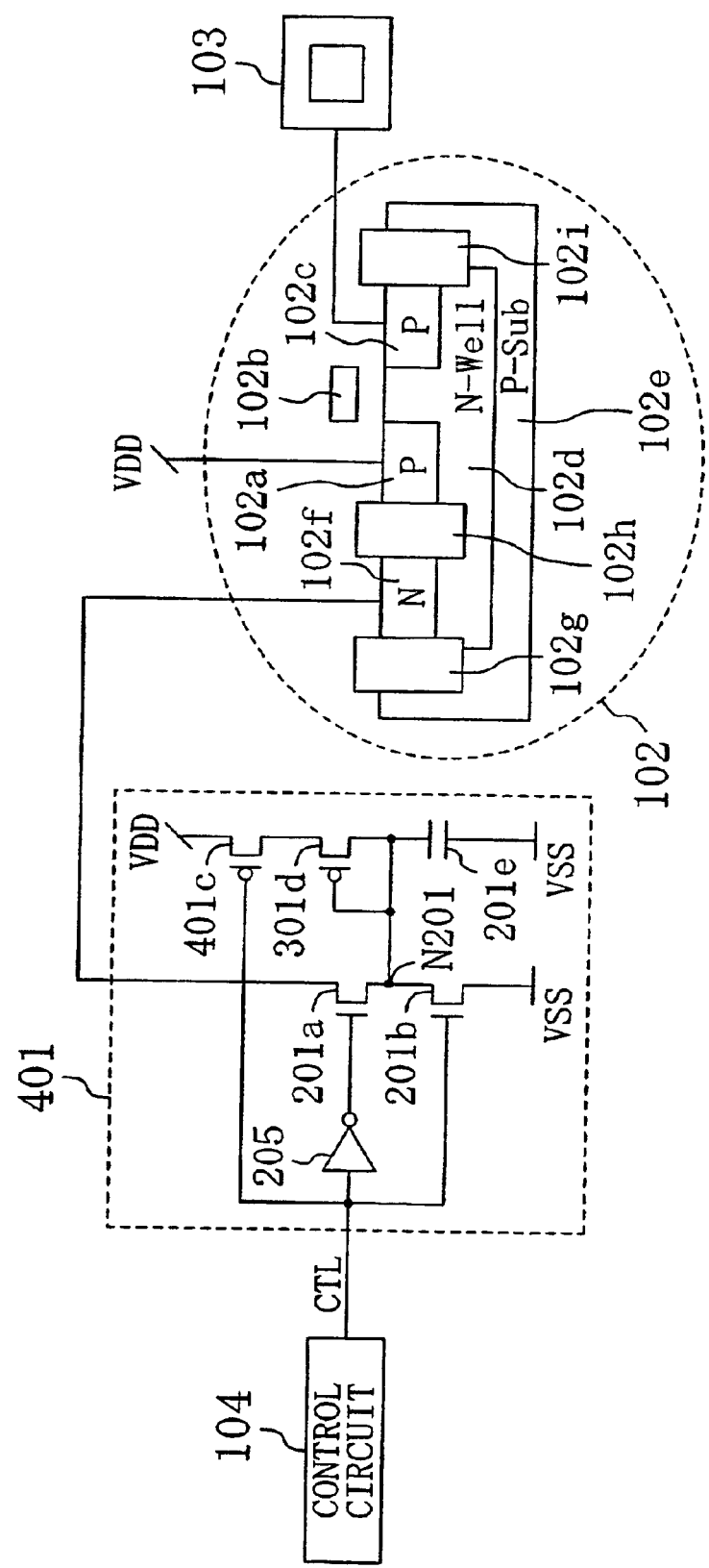
FIG. 4 is an illustration of an output part of an input/output circuit of Embodiment 4 of the present invention.

The input/output circuit of Embodiment 4 of the present invention includes a charge drawing circuit 401 shown in FIG. 4 in place of the charge drawing circuit 301 shown in FIG. 3. The other components of the input/output circuit are the same as those of the input/output circuit of Embodiment 3. FIG. 4 illustrates an output part of the input/output circuit of Embodiment 4. Referring to FIG. 4, the charge drawing circuit 401 includes the inverter circuit 205, the n-channel transistors 201a and 201b, the capacitance 201e, the p-channel transistor 301d and a p-channel transistor 401c. The p-channel transistor 401c is connected in series with the p-channel transistor 301d between the power supply node receiving the supply voltage VDD and the node N201, and receives the control signal CTL from the control circuit 104 at its gate. Assume that the threshold voltage Vtp (V) of the p-channel transistor 301d and the threshold voltage Vtn (V) of the n-channel transistor 201a have the following relationship.

$$|Vtp|>Vtn \qquad \text{Expression (9)}$$

Hereinafter, the operation of the input/output circuit with the above configuration will be described.

As in Embodiment 3, the LSI is prevented from destruction even when a voltage higher than the supply voltage VDD (V) internal to the LSI is input into the LSI in the input state. In addition, in this embodiment, since the control signal CTL is at the H level in the input state, the p-channel transistor 401c receiving this signal at its gate is turned OFF. Thus, the through current flowing along the route of the power supply node—the p-channel transistor 301d—the n-channel transistor 201b—the ground node can be reduced.

Next, the case that the input/output circuit is in the output state will be described.

Suppose the diffusion parasitic capacitance values of the n-channel transistors 201a and 201b connected to the node N201 are C201a (F) and C201b (F), respectively, the sum of the diffusion parasitic capacitance value and the gate parasitic capacitance value of the p-channel transistor 301d connected to the node N201 is C301d (F), the capacitance value of the capacitance 201e is C201e (F), and the parasitic capacitance value of the n-well diffusion region 102d of the p-channel transistor 102 is C102d (F). Assume that the C201a+C201b+C301d+C201e satisfies the following.

$$(VH-VDD+Vtn)/(|Vtp|-Vth) \times C102d < C201a + C201b+C301d+C201e \qquad \text{Expression (10)}$$

Under the above assumption, the potential Vlast (V) at the n-well diffusion region 102d after the connection satisfies the following.

$$Vlast<VDD-Vtn \qquad \text{Expression (11)}$$

The potential at the n-well diffusion region 102d, which has dropped as described above, then rises to VDD (V) due to the PN junction with the source diffusion region 102a. In this way, in the output state, the n-well diffusion region 102d always resumes the voltage VDD (V). Accordingly, it is possible to prevent deterioration in current flow capability due to the back bias effect of the p-channel transistor 102 of the output part.

Normally, C102d is a comparatively small value. Therefore, if the condition of Expression (10) is satisfied only with C201a, C201b and C301d, the capacitance 201e in FIG. 4 is unnecessary.

Thus, Embodiment 4 provides not only the effect of preventing deterioration in current flow capability due to the back bias effect of the p-channel transistor 102 of the output part because the n-well diffusion region 102d always resumes the supply voltage VDD (V) in the output state, but also the effect of reducing the through current in the input state.

The node N201 is at the ground voltage in the input state because the p-channel transistor 401c is turned OFF. Therefore, some delay time may preferably be provided for the inverter circuit 205 to avoid the n-well diffusion region 102d from being drawn to the ground voltage.

Embodiment 5

In the input/output circuit of Embodiment 1, when a voltage higher than the supply voltage internal to the LSI is applied to the input/output pad 103 in the input state, a voltage exceeding the withstand voltage may be applied to a transistor of the charge drawing circuit 101, and this may destroy the circuit. Embodiment 5 aims to overcome this problem.

Figure 5:
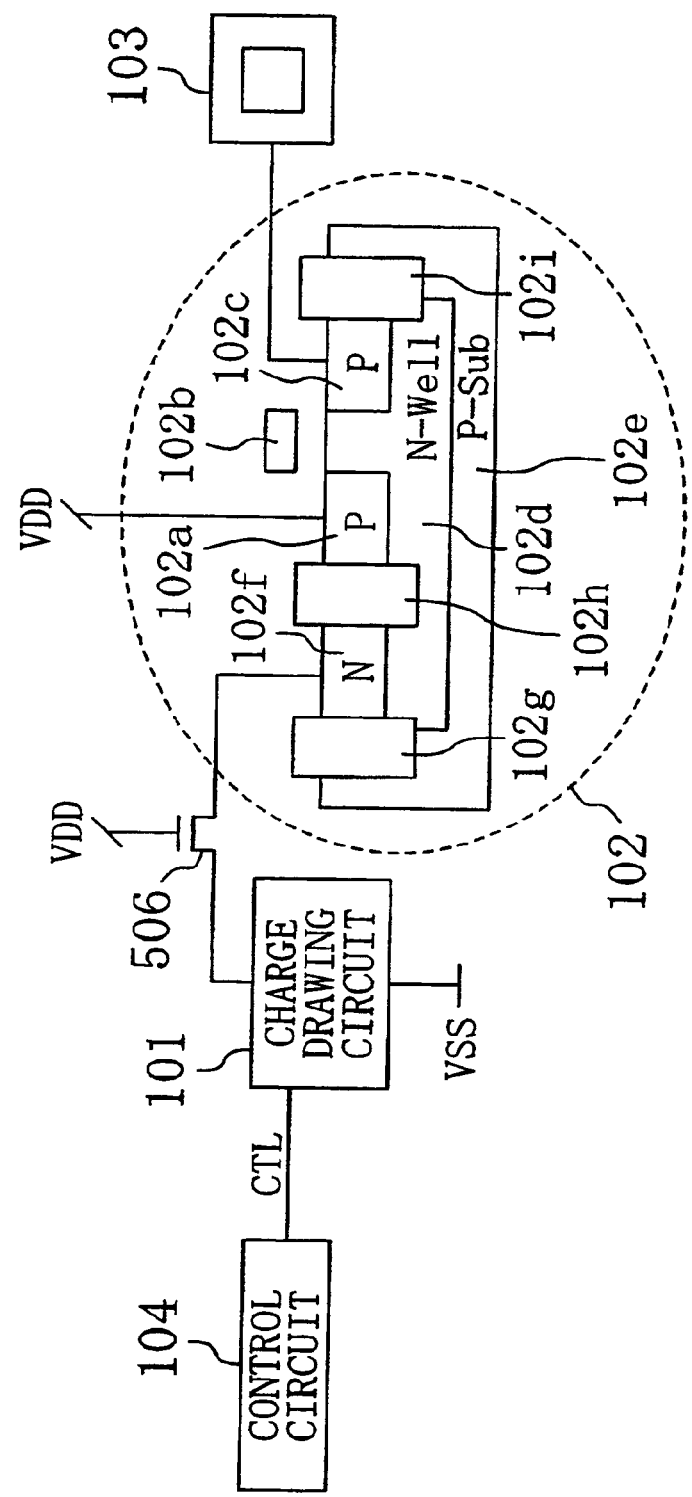
FIG. 5 is an illustration of an output part of an input/output circuit of Embodiment 5 of the present invention.

As shown in FIG. 5, the input/output circuit of Embodiment 5 of the present invention includes an n-channel transistor 506 in addition to the components of the input/output circuit of Embodiment 1. The n-channel transistor 506 is connected between the n-diffusion region 102f of the p-channel transistor 102 and the charge drawing circuit 101, and receives the supply voltage VDD internal to the LSI at its gate.

In this embodiment, as in Embodiment 1, even when a voltage higher than the LSI internal supply voltage is input in the input state, the LSI is prevented from destruction due to flow of a forward current from the drain diffusion region 102c to the n-well diffusion region 102d.

As for the charge drawing circuit 101, when a voltage VH (V) higher than the internal supply voltage is applied to the input/output pad 103, the voltage VH (V) is also applied to the n-well diffusion region 102d and the n-diffusion region 102f due to the PN junction between the drain diffusion 102c and the n-well diffusion region 102d. The gate of the n-channel transistor 506 receives the internal supply voltage VDD. Therefore, only a voltage VDD−Vtn (wherein Vtn (V) is the threshold of the n-channel transistor 506) is applied to the charge drawing circuit 101. With this voltage, which is lower than the internal supply voltage VDD (V), the charge drawing circuit 101 is not easily destroyed. Thus, in the input state, since only a voltage lower than the LSI internal supply voltage is applied to the charge drawing circuit 101, the charge drawing circuit 101 is resistant to destruction.

In the output state, as in Embodiment 1, since the n-well diffusion region 102d always resumes VDD (V), it is possible to reduce deterioration in current flow capability due to the back bias effect of the p-channel transistor 102 of the output part.

Embodiment 6

An input/output circuit of Embodiment 6 of the present invention, placed inside a semiconductor integrated circuit (LSI), includes an input part and an output part. The input part receives a signal from the outside of the LSI and passes the signal to an internal circuit of the LSI. The output part receives a signal from an internal circuit of the LSI and outputs the signal to the outside of the LSI.

Figure 6:
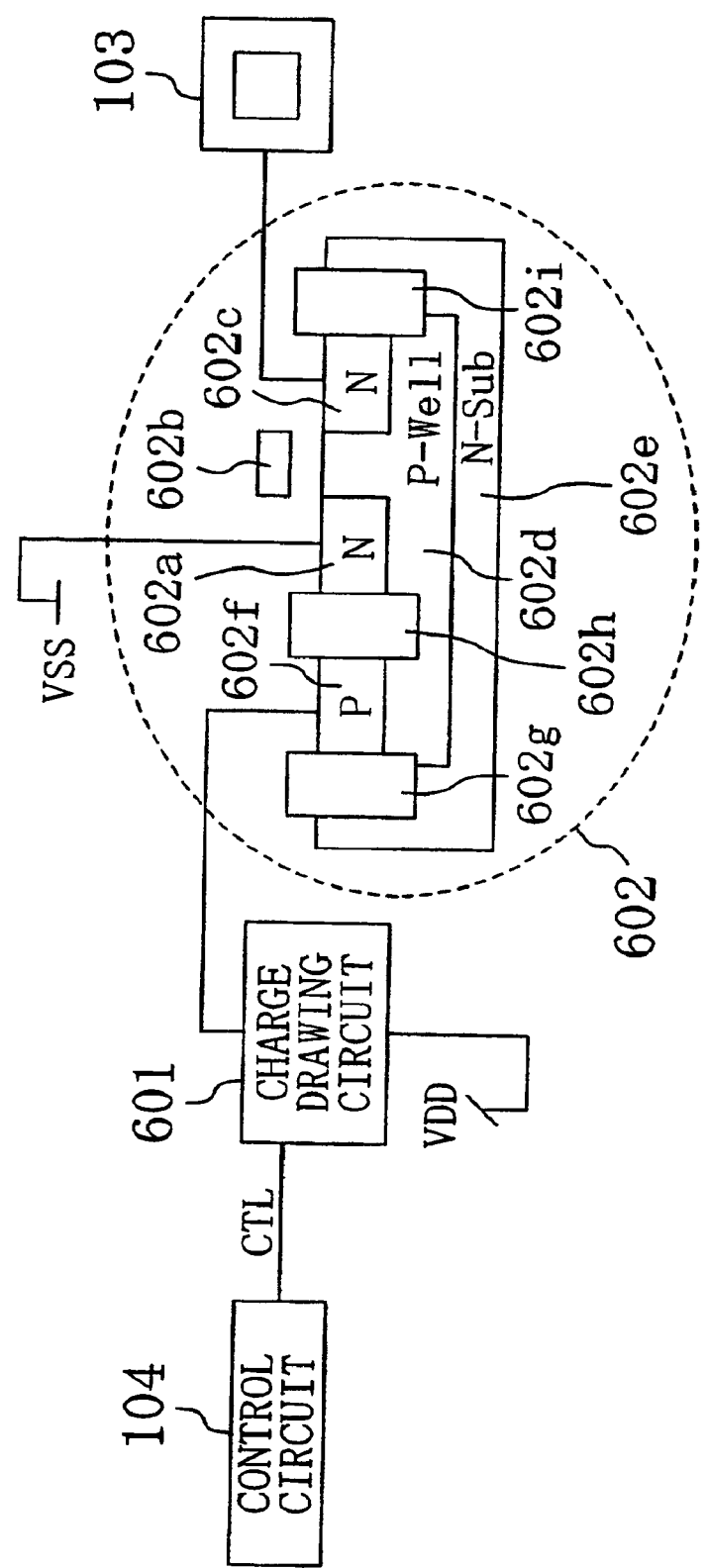
FIG. 6 is an illustration of an output part of an input/output circuit of Embodiment 6 of the present invention.

FIG. 6 illustrates the output part of the input/output circuit of Embodiment 6. Referring to FIG. 6, the output part includes an n-channel transistor 602, a charge drawing circuit 601 and a control circuit 104. The n-channel transistor 602 includes a source diffusion region 602a, a gate 602b, a drain diffusion region 602c, a p-well diffusion region 602d, a substrate 602e, a p-diffusion region 602f and device isolators 602g, 602h and 602i. The control circuit 104 outputs an L-level (ground voltage level) control signal CTL when the input/output circuit is in the output state and outputs an H-level (supply voltage level) control signal CTL when the input/output circuit is in the input state. The charge drawing circuit 601 draws a charge from the p-well diffusion region 602d to the supply voltage VDD via the p-diffusion region 602f when the control signal CTL is at the L level, and does not draw a charge when the control signal CTL is at the H level.

For simplification of description, the input part and a p-channel transistor of the output part are omitted in FIG. 6. A signal to be output externally is supplied to the gates of the n-channel transistor 602 and the p-channel transistor directly or indirectly from an internal circuit of the LSI.

The input/output of signals into/from the LSI having the input/output circuit shown in FIG. 6 is entirely performed via the input/output pad 103.

The source diffusion region 602a is grounded. Therefore, in the initial state, the potential at the p-well diffusion region 602d is as low as the ground voltage due to the PN junction with the source diffusion region 602a.

Hereinafter, the operation of the input/output circuit having the above configuration will be described.

First, the case that the input/output circuit is in the input state (a signal from the outside of the LSI is input into an internal circuit of the LSI) will be described.

In the above state, the control circuit 104 outputs the H-level control signal CTL. Receiving the H-level control signal CTL, the charge drawing circuit 601 does not draw a charge. Therefore, the p-well diffusion region 602d is isolated from a power supply node receiving the supply voltage VDD. In this state, when a signal at a voltage VL (V) lower than the ground voltage VSS is input into the input/output pad 103, the potential at the p-well diffusion region 602d drops to as low as VL (V) due to the PN junction with the drain diffusion region 602c. A current flows from the input/output pad 103 during the discharging of the p-well diffusion region 602d to VL (V). However, the current flow stops once the potential at the p-well diffusion region 602d reaches VL (V). Also, at this time, a reverse voltage is applied to the PN junction between the p-well diffusion region 602d and the source diffusion region 602a. Therefore, no large current will flow between the p-well diffusion region 602d and the source diffusion region 602a. Accordingly, the LSI having the input/output circuit shown in FIG. 6 is prevented from destruction even when a voltage lower than the ground voltage VSS is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level control signal CTL, the charge drawing circuit 601 draws a charge from the p-well diffusion region 602d via the p-diffusion region 602f. Thus, a charge accumulated in the p-well diffusion region 602d is drawn to the supply voltage VDD. The potential at the p-well diffusion region 602d therefore rises and once it is higher than the ground voltage VSS, it resumes the ground voltage VSS due to the PN junction with the source diffusion region 602a. In this way, in the output state, the p-well diffusion region 602d always remains the ground voltage VSS. Accordingly, it is possible to prevent deterioration in current flow capability due to the back bias effect of the n-channel transistor 602 of the output part.

It is important to draw a charge to the power supply node because if a charge having a potential lower than the ground voltage is drawn to the ground node, the n-channel transistor connected to a ground voltage line may possibly cause latch-up.

Embodiment 7

Figure 7:
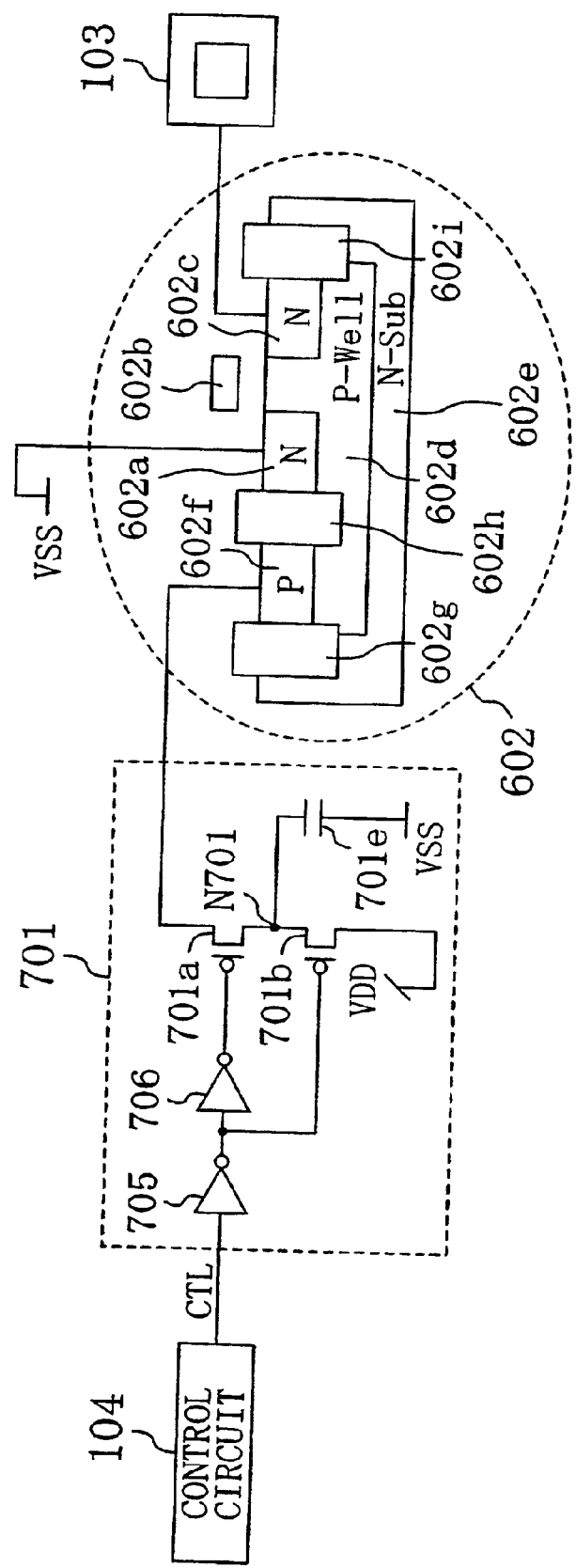
FIG. 7 is an illustration of an output part of an input/output circuit of Embodiment 7 of the present invention.

The input/output circuit of Embodiment 7 of the present invention includes a charge drawing circuit 701 shown in FIG. 7 in place of the charge drawing circuit 601 shown in FIG. 6. The other components of the input/output circuit are the same as those of the input/output circuit of Embodiment 6. FIG. 7 illustrates an output part of the input/output circuit of Embodiment 7. Referring to FIG. 7, the charge drawing circuit 701 includes inverter circuits 705 and 706, p-channel transistors 701a and 701b and a capacitance 701e. The inverter circuit 705 inverts the control signal CTL from the control circuit 104. The inverter circuit 706 inverts the output of the inverter circuit 705. The p-channel transistor 701a, connected between the p-diffusion region 602f of the n-channel transistor 602 and a node N701, receives the output of the inverter circuit 706 at its gate. The p-channel transistor 701b, connected between the node N701 and a power supply node receiving the supply voltage VDD, receives the output of the inverter circuit 705 at its gate. The capacitance 701e is connected between the node N701 and a ground node receiving the ground voltage VSS.

Hereinafter, the operation of the input/output circuit with the above configuration will be described.

First, the case that the input/output circuit is in the input state (a signal from the outside of the LSI is input into an internal circuit of the LSI) will be described.

In the input state, the control circuit 104 outputs the H-level control signal CTL. Receiving the H-level signal, the inverter circuit 705 outputs an L-level signal. This turns the p-channel transistor 701b ON and the p-channel transistor 701a OFF. Therefore, the potential at the node N701 becomes the H level, and the capacitance 701e is charged to the supply voltage VDD (V). As a result, the charge drawing circuit 701 does not draw a charge, and thus the p-well diffusion region 602d of the n-channel transistor 602 is isolated from the power supply node receiving the supply voltage VDD. In this state, when a signal at a voltage VL (V) lower than the ground voltage VSS is input into the input/output pad 103, the p-well diffusion region 602d drops to as low as VL (V) due to the PN junction with the drain diffusion region 602c. A current flows into the input/output pad 103 during the discharging of the p-well diffusion region 602d to VL (V). However, the current flow stops once the potential at the p-well diffusion region 602d reaches VL (V). Also, at this time, a reverse voltage is applied to the PN junction between the p-well diffusion region 602d and the source diffusion region 602a. Therefore, no large current will flow between the p-well diffusion region 602d and the source diffusion region 602a. Accordingly, the LSI having the input/output circuit shown in FIG. 7 is prevented from destruction even when a voltage lower than the ground voltage is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level signal, the inverter circuit 705 outputs an H-level signal, and the inverter circuit 706 outputs an L-level signal. This turns the p-channel transistor 701b OFF and the p-channel transistor 701a ON. Thus, the node N701 and the p-well diffusion region 602d are electrically connected via the p-channel transistor 701a. Suppose the diffusion parasitic capacitance values of the p-channel transistors 701a and 701b connected to the node N701 are C701a (F) and C701b (F), respectively, the capacitance value of the capacitance 701e is C701e (F), the parasitic capacitance value of the p-well diffusion region 602d is C602d (F), and the total capacitance value Call7 (F) is as follows.

$$\text{Call7} = C701a + C701b + C701e + C602d \quad \text{Expression (12)}$$

The potential Vlast (V) at the p-well diffusion region 602d after the connection is calculated as follows, under the assumption that the p-channel transistor 701a remains ON until the final state.

$$\text{Vlast} = C602d/\text{Call7} \times \text{VL} + (\text{Call7} - C602d)/\text{Call7} \times \text{VDD} \quad \text{Expression (13)}$$

The condition under which the p-channel transistor 701a remains ON until the final state is as follows.

$$(-\text{VL} + |\text{Vtp}|)/(\text{VDD} - |\text{Vtp}|) \times C602d < C701a + C701b + C701e \quad \text{Expression (14)}$$

wherein Vtp is the threshold voltage of the p-channel transistor 701a. Assume that C701a+C701b+C701e satisfies the above condition. Normally, C602d is a comparatively small value. Therefore, if the condition of Expression (14) is satisfied only with C701a and C701b, the capacitance 701e in FIG. 7 is unnecessary. Under the above assumption, the Vlast (V) satisfies the following.

$$\text{Vlast} > |\text{Vtp}| \quad \text{Expression (15)}$$

As described above, the potential at the p-well diffusion region 602d rises above the ground voltage. The potential at the p-well diffusion region 602d that has risen then drops to the ground voltage due to the PN junction with the source diffusion region 602a. In this way, in the output state, the p-well diffusion region 602d always resumes the ground voltage. Accordingly, it is possible to prevent deterioration in current flow capability due to the back bias effect of the n-channel transistor 602 of the output part.

Embodiment 8

In the input/output circuit of Embodiment 7, the node N701 of the charge drawing circuit 701 is at the H level (supply voltage level) in the input state. Therefore, when the state is switched to the output state, part of the p-well diffusion region 602d of the n-channel transistor 602 may possibly be at the supply voltage momentarily, and this may easily cause latch-up. Embodiment 8 aims to overcome this problem.

Figure 8:
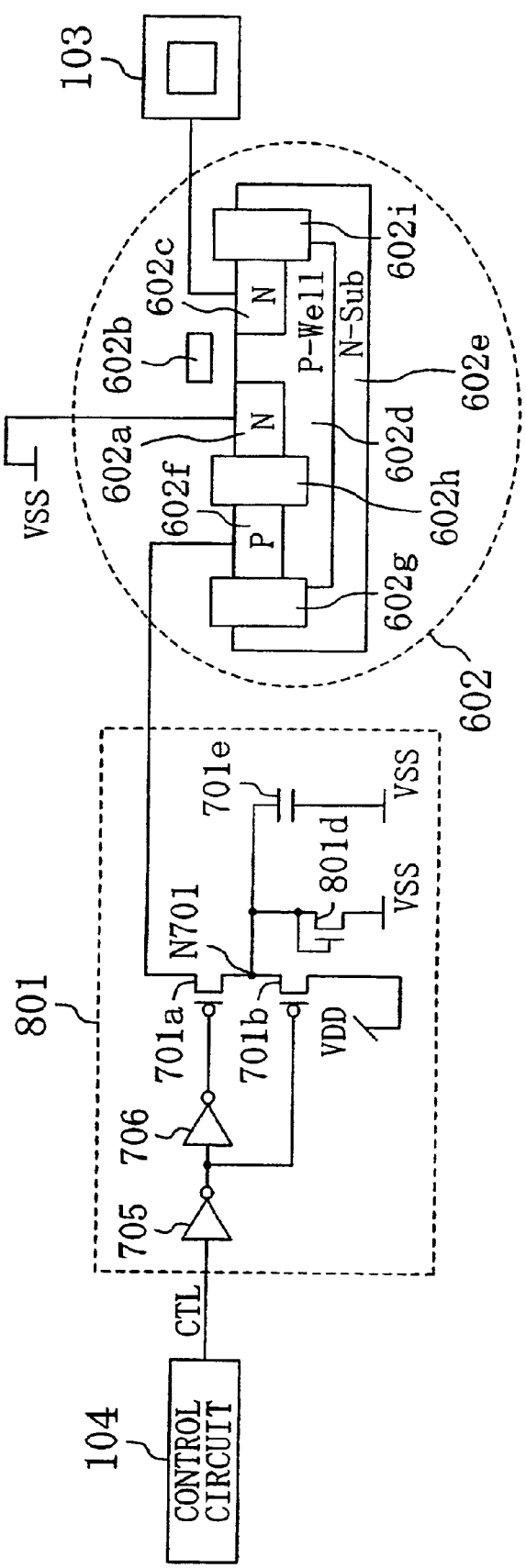
FIG. 8 is an illustration of an output part of an input/output circuit of Embodiment 8 of the present invention.

The input/output circuit of Embodiment 8 of the present invention includes a charge drawing circuit 801 shown in FIG. 8 in place of the charge drawing circuit 701 shown in FIG. 7. The other components of the input/output circuit are the same as those of the input/output circuit of Embodiment 7. FIG. 8 illustrates an output part of the input/output circuit of Embodiment 8. Referring to FIG. 8, the charge drawing circuit 801 includes the inverter circuits 705 and 706, the p-channel transistors 701a and 701b, the capacitance 701e and an n-channel transistor 801d. The n-channel transistor 801d is connected between the node N701 and a ground node receiving the ground voltage VSS in parallel with the capacitance 701e, and receives a voltage at the node N701 at its gate. Assume that the threshold voltage Vtn (V) of the n-channel transistor 801d and the threshold voltage Vtp (V) of the p-channel transistor 701a have the following relationship.

$$\text{Vtn} > |\text{Vtp}| \quad \text{Expression (16)}$$

Hereinafter, the operation of the input/output circuit with the above configuration will be described.

First, the case that the input/output circuit is in the input state (a signal from the outside of the LSI is input into an internal circuit of the LSI) will be described.

In the input state, the control circuit 104 outputs the H-level control signal CTL. Receiving the H-level signal, the inverter circuit 705 outputs an L-level signal, and the inverter circuit 706 outputs an H-level signal. This turns the p-channel transistor 701b ON and the p-channel transistor 701a OFF. Therefore, the node N701 becomes the H level, and thus the n-channel transistor 801d is turned ON. With the n-channel transistor 801d being turned ON, the potential at the node N701 drops. Finally, the n-channel transistor 801d is turned OFF when the potential at the node N701 reaches Vtn. Therefore, the charge drawing circuit 801 does not draw a charge, and thus the p-well diffusion region 602d of the n-channel transistor 602 is isolated from the power supply node. In this state, when a signal at a voltage VL (V) lower than the ground voltage is input into the input/output pad 103, the potential at the p-well diffusion region 602d drops to as low as VL (V) due to the PN junction with the drain diffusion region 602c. A current flows into the input/output pad 103 during the discharging of the p-well diffusion region 602d to VL (V). However, the current flow stops once the potential at the p-well diffusion region 602d reaches VL (V). Also, at this time, a reverse voltage is applied to the PN junction between the p-well diffusion region 602d and the source diffusion region 602a. Therefore, no large current will flow between the p-well diffusion region 602d and the source diffusion region 602a. Accordingly, the LSI having the input/output circuit shown in FIG. 8 is prevented from destruction even when a voltage lower than the ground voltage is input into the LSI.

Next, the case that the input/output circuit is in the output state (a signal from an internal circuit of the LSI is output to the outside of the LSI) will be described.

In the output state, the control circuit 104 outputs the L-level control signal CTL. Receiving the L-level signal, the inverter circuit 705 outputs an H-level signal, and the inverter circuit 706 outputs an L-level signal. This turns the p-channel transistor 701b OFF. As for the p-channel transistor 701a, the gate potential is the ground voltage VSS and the source potential is Vtn. Therefore, the gate-source voltage is Vtn. From the condition of Expression (16) above, the p-channel transistor 701a is turned ON, and the n-channel transistor 801d is OFF. Thus, the node N701 and the p-well diffusion region 602d are electrically connected via the p-channel transistor 701a. Suppose the diffusion parasitic capacitance values of the p-channel transistors 701a and 701b connected to the node N701 are C701a (F) and C701b (F), respectively, the sum of the diffusion parasitic capacitance value and the gate parasitic capacitance value of the n-channel transistor 801d connected to the node N701 is C801d (F), the capacitance value of the capacitance 701e is C701e (F), the parasitic capacitance value of the p-well diffusion region 602d is C602d (F), and the total capacitance value Call8 (F) is as follows.

$$Call8 = C701a + C701b + C801d + C701e + C602d \quad \text{Expression (17)}$$

The potential Vlast (V) at the p-well diffusion region 602d after the connection is calculated as follows, under the assumption that the p-channel transistor 701a remains ON until the final state.

$$Vlast = ((Call8 - C602d) \times Vtn + C602d \times VL)/Call8 \quad \text{Expression (18)}$$

The condition under which the p-channel transistor 701a remains ON until the final state is as follows.

$$(|Vtp| - VL)/(Vtn - |Vtp|) \times C602d < C701a + C701b + C801d + C701e \quad \text{Expression (19)}$$

Assume that C701a+C701b+C801d+C701e satisfies the above condition. Normally, C602d is a comparatively small value. Therefore, if the condition of Expression (19) is satisfied only with C701a, C701b and C801d, the capacitance 701e in FIG. 8 is unnecessary. Under the above assumption, the Vlast (V) satisfies the following.

$$Vlast > |Vtp| \quad \text{Expression (20)}$$

As described above, the potential at the p-well diffusion region 602d rises above the ground voltage. The potential at the p-well diffusion region 602d that has risen then drops to the ground voltage due to the PN junction with the source diffusion region 602a. In this way, in the output state, the p-well diffusion region 602d always resumes the ground voltage. Accordingly, it is possible to prevent deterioration in current flow capability due to the back bias effect of the n-channel transistor 602 of the output part.

In the input state, the node N701 is at a potential lower than the supply voltage. Therefore, a voltage lower than the supply voltage is applied to the p-well diffusion region 602d when the state is switched to the output state. Thus, latch-up will not easily occur.

Due to the existence of the inverter circuit 706, the p-channel transistors 701a and 701b may momentarily be turned ON simultaneously when the state is switched from the output state to the input state. In such an event, however, the potential at the p-well diffusion region 602d is prevented from rising to Vtn or higher due to the discharging by the p-channel transistor 801d. This suppresses occurrence of latch-up.

Embodiment 9

In the input/output circuit of Embodiment 8, a through current flows along the route of the power supply node—the p-channel transistor 701b—n-channel transistor 801d—the ground node in the input state. Embodiment 9 aims to overcome this problem.

Figure 9:
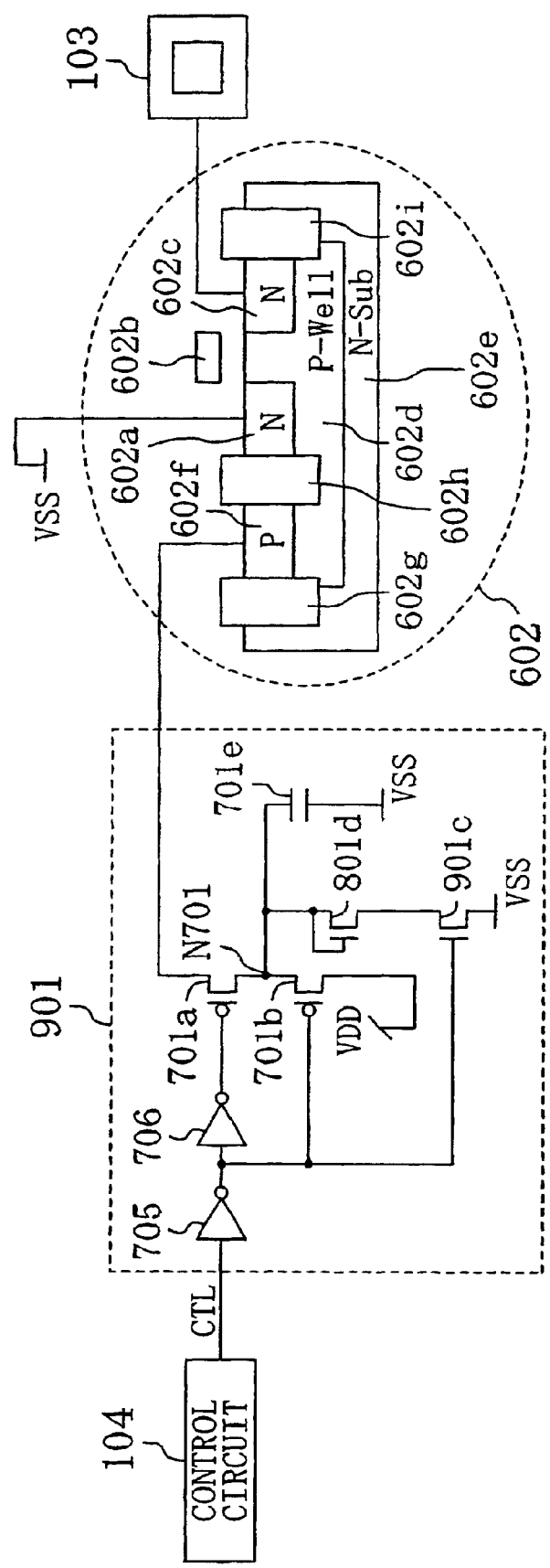
FIG. 9 is an illustration of an output part of an input/output circuit of Embodiment 9 of the present invention.

The input/output circuit of Embodiment 9 of the present invention includes a charge drawing circuit 901 shown in FIG. 9 in place of the charge drawing circuit 801 shown in FIG. 8. The other components of the input/output circuit are the same as those of the input/output circuit of Embodiment 8. FIG. 9 illustrates an output part of the input/output circuit of Embodiment 9. Referring to FIG. 9, the charge drawing circuit 901 includes the inverter circuits 705 and 706, the p-channel transistors 701a and 701b, the capacitance 701e, the n-channel transistor 801d and an n-channel transistor 901c. The n-channel transistor 901c is connected in series with the n-channel transistor 801d between the node N701 and the ground node, and receives the output of the inverter circuit 705 at its gate. Assume that the threshold voltage Vtn (V) of the n-channel transistor 801d and the threshold voltage Vtp (V) of the p-channel transistor 701a have the following relationship.

$$Vtn > |Vtp| \quad \text{Expression (21)}$$

Hereinafter, the operation of the input/output circuit with the above configuration will be described.

As in Embodiment 8, the LSI is prevented from destruction even when a voltage lower than the ground voltage is input into the LSI in the input state. In addition, in this embodiment, since the control signal CTL is at the H level in this state and the inverter circuit 705 outputs an L-level signal, the n-channel transistor 901c receiving this signal at its gate is turned OFF. Thus, the through current flowing along the route of the power supply node—the p-channel transistor 701b—the n-channel transistor 801d—the ground node can be reduced.

Next, the case that the input/output circuit is in the output state will be described.

Suppose the diffusion parasitic capacitance values of the p-channel transistors 701a and 701b connected to the node N701 are C701a (F) and C701b (F), respectively, the sum of the diffusion parasitic capacitance value and the gate parasitic capacitance value of the n-channel transistor 801d connected to the node N701 is C801d (F), the capacitance value of the capacitance 701e is C701e (F), and the parasitic capacitance value of the p-well diffusion region 602d is C602d (F). Suppose also C701a +C701b+C801d+C701e satisfies the following.

$$(|Vtp| - VL)/(Vtn - |Vtp|) \times C602d < C701a + C701b + C801d + C701e \quad \text{Expression (22)}$$

Under this condition, the Vlast (V) of the p-well diffusion region 602d after the connection satisfies the following.

$$Vlast > |Vtp| \quad \text{Expression (23)}$$

The potential at the p-well diffusion region 602d, which has risen as described above, then drops to the ground voltage due to the PN junction with the source diffusion region 602a. Thus, in the output state, the p-well diffusion region 602d always resumes the ground voltage VSS. In this way, it is possible to prevent deterioration in current flow capability due to the back bias effect of the n-channel transistor 602 of the output part.

Normally, C602d is a comparatively small value. Therefore, if the condition of Expression (22) is satisfied only with C701a, C701b and C801d, the capacitance 701e in FIG. 9 is unnecessary.

Thus, Embodiment 9 provides not only the effect of preventing deterioration in current flow capability due to the back bias effect of the n-channel transistor 602 of the output part because the p-well diffusion region 602d always resumes the ground voltage in the output state, but also the effect of reducing the through current in the input state.

The node N701 is at the supply voltage in the input state because the n-channel transistor 901c is turned OFF. Therefore, some delay time may preferably be provided for the inverter circuit 705 to avoid the p-well diffusion region 602d from being drawn to the supply voltage.

Embodiment 10

In the input/output circuit of Embodiment 6, when a voltage lower than the ground voltage is applied to the input/output pad 103 in the input state, a voltage exceeding the withstand voltage may be applied to a transistor of the charge drawing circuit 601, and this may destroy the circuit. Embodiment 10 aims to overcome this problem.

Figure 10:
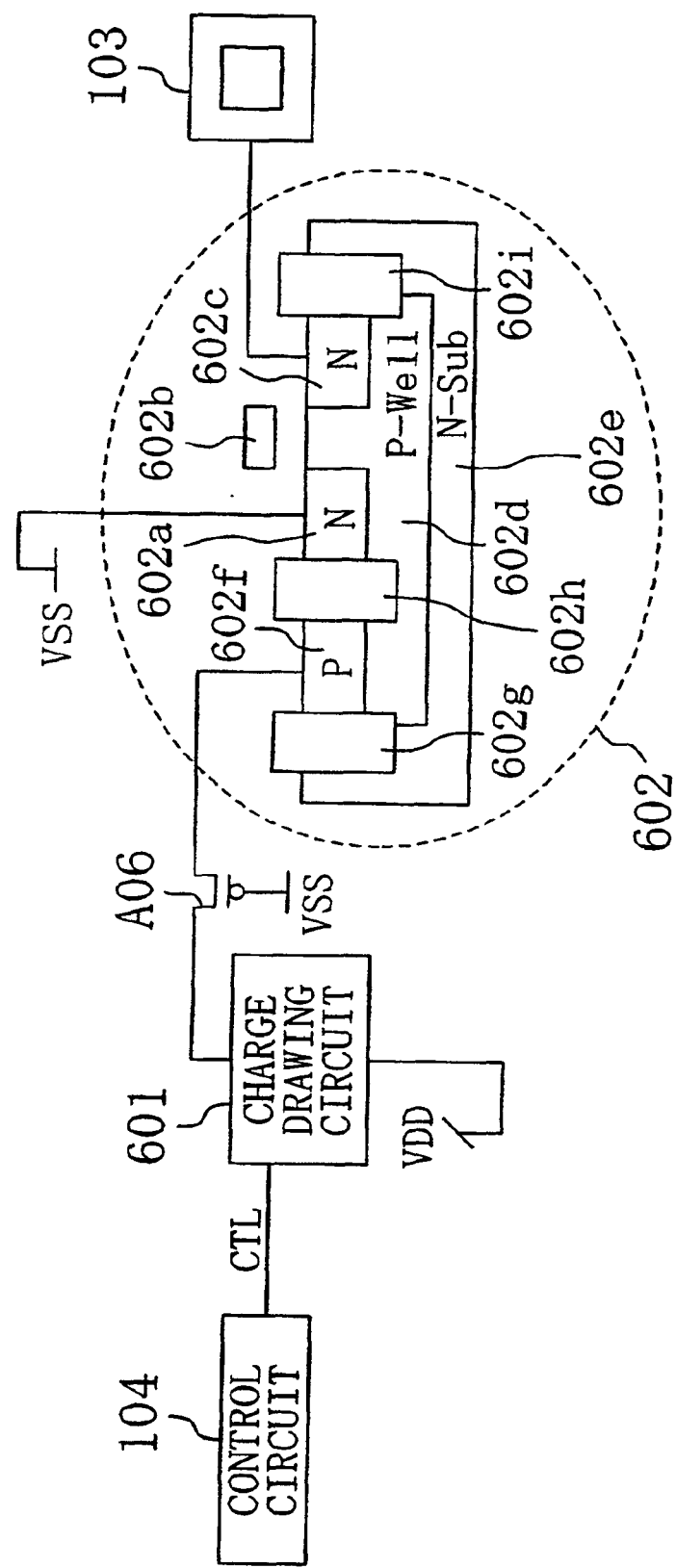
FIG. 10 is an illustration of an output part of an input/output circuit of Embodiment 10 of the present invention.
Figure 11:
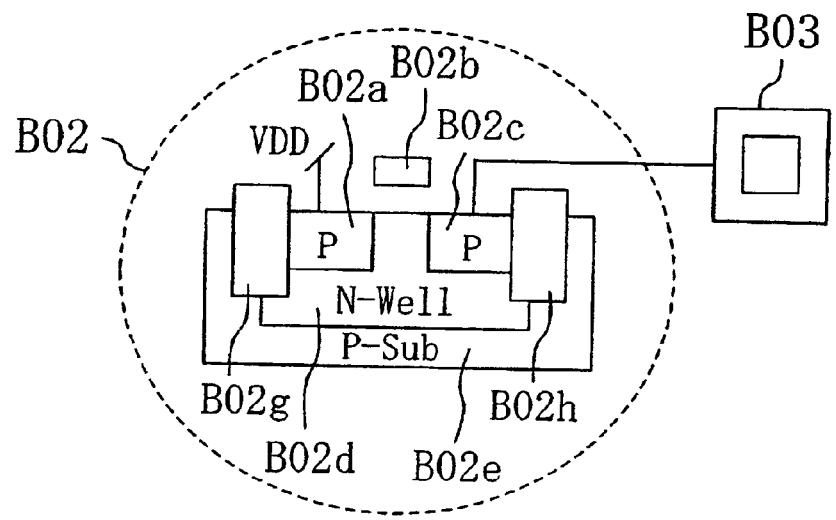
FIG. 11 is an illustration of an output part of a conventional input/output circuit.
Figure 12:
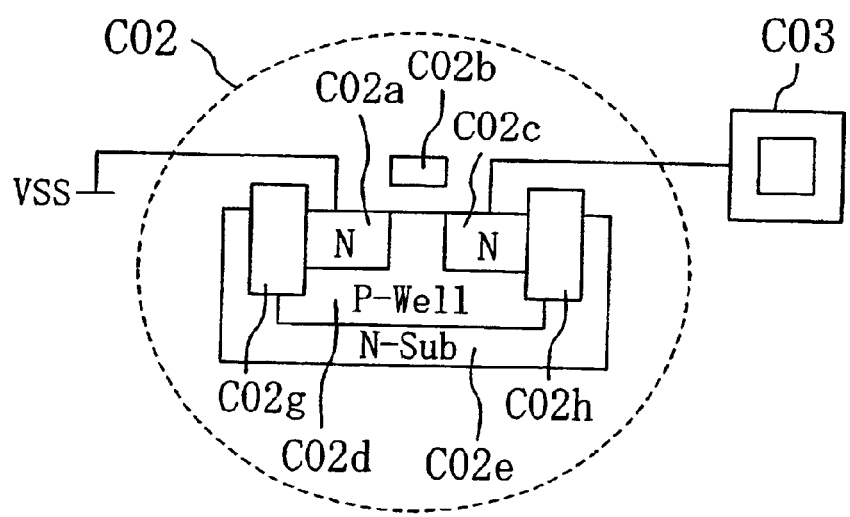
FIG. 12 is an illustration of an output part of another conventional input/output circuit.

As shown in FIG. 10, the input/output circuit of Embodiment 10 of the present invention includes a p-channel transistor A06 in addition to the components of the input/output circuit of Embodiment 6. The p-channel transistor A06 is connected between the p-diffusion region 602f of the n-channel transistor 602 and the charge drawing circuit 601, and receives the ground voltage VSS at its gate.

In this embodiment, as in Embodiment 6, even when a voltage lower than the ground voltage is input in the input state, the LSI is prevented from destruction due to flow of a forward current from the drain diffusion region 602c to the p-well diffusion region 602d.

As for the charge drawing circuit 601, when a voltage VL (V) lower than the ground voltage is applied to the input/output pad 103, the voltage VL (V) is also applied to the p-well diffusion region 602d and the p-diffusion region 602f due to the PN junction between the drain diffusion 602c and the p-well diffusion region 602d. The gate of the p-channel transistor A06 is grounded. Therefore, only a voltage |Vtp| (wherein Vtp is the threshold of the p-channel transistor A06) is applied to the charge drawing circuit 601. With this voltage, which is higher than the ground voltage, the charge drawing circuit 601 is not easily destroyed. Thus, in the input state, since only a voltage higher than the ground voltage is applied to the charge drawing circuit 601, the charge drawing circuit 601 is resistant to destruction.

In the output state, as in Embodiment 6, since the p-well diffusion region 602d always resumes the ground voltage, it is possible to reduce deterioration in current flow capability due to the back bias effect of the n-channel transistor 602 of the output part.

While the present invention has been described in a preferred embodiment, it will be apparent to those skilled in the art that the disclosed invention may be modified in numerous ways and may assume many embodiments other than that specifically set out and described above. Accordingly, it is intended by the appended claims to cover all modifications of the invention which fall within the true spirit and scope of the invention.

What is claimed is:

1. An input/output circuit of a semiconductor integrated circuit, comprising:
   a first p-channel transistor connected to an input/output pad of the semiconductor integrated circuit; and
   a charge drawing circuit for drawing a charge from an n-well diffusion region of the first p-channel transistor, wherein the charge drawing circuit comprises:
   a first n-channel transistor connected between the n-well diffusion region of the first p-channel transistor and a first node, the first-n-channel transistor being turned ON when the input/output circuit outputs a signal to the input/output pad; and
   a second n-channel transistor connected to the first node, the second n-channel transistor being turned OFF when the input/output circuit outputs a signal to the input/output pad.

2. The input/output circuit of claim 1, wherein the charge drawing circuit further comprises:
   a second p-channel transistor connected to the first node and receiving a voltage at the first node at its gate, the absolute of the threshold of the second p-channel transistor being greater than the threshold of the first n-channel transistor.

3. The input/output circuit of claim 2, wherein the charge drawing circuit further comprises:
   a third p-channel transistor connected to the second p-channel transistor, the third p-channel transistor being turned ON when the input/output circuit outputs a signal to the input/output pad and otherwise turned OFF.

4. An input/output circuit of a semiconductor integrated circuit, comprising:
   a first n-channel transistor connected to an input/output pad of the semiconductor integrated circuit; and
   a charge drawing circuit for drawing a charge from a p-well diffusion region of the first n-channel transistor, wherein the charge drawing circuit comprises:
   a first p-channel transistor connected between the p-well diffusion region of the first n-channel transistor and a first node, the first p-channel transistor being turned ON when the input/output circuit outputs a signal to the input/output pad; and
   a second p-channel transistor connected to the first node, the second p-channel transistor being turned OFF when the input/output circuit outputs a signal to the input/output pad.

5. The input/output circuit of claim 4, wherein the charge drawing circuit further comprises:
   a second n-channel transistor connected to the first node and receiving a voltage at the first node at its gate, the threshold of the second n-channel transistor being greater than the absolute of the threshold of the first p-channel transistor.

6. The input/output circuit of claim 5, wherein the charge drawing circuit further comprises:
   a third n-channel transistor connected to the second n-channel transistor, the third n-channel transistor being turned ON when the input/output circuit outputs a signal to the input/output pad and otherwise turned OFF.

7. An input/output circuit for outputting a signal from an internal circuit of a semiconductor integrated circuit to an input/output pad of the semiconductor integrated circuit, comprising:
   a first p-channel transistor connected between a power supply node receiving a supply voltage internal to the semiconductor integrated circuit and the input/output pad, a gate of the first p-channel transistor receiving a signal from an internal circuit of the semiconductor integrated circuit directly or indirectly; and
   a charge drawing circuit for drawing a charge from an n-well diffusion region of the first p-channel transistor to a ground node receiving a ground voltage when the input/output circuit outputs the signal from the internal circuit to the input/output pad, wherein the charge drawing circuit comprises:
   a first n-channel transistor connected between the n-well diffusion region of the first p-channel transistor and a first node, the first n-channel transistor being turned ON when the input/output circuit outputs the signal from the internal circuit to the input/output pad; and a second n-channel transistor connected between the first node and the ground node, the second n-channel transistor being turned OFF when the input/output circuit outputs the signal from the internal circuit to the input/output pad.

8. The input/output circuit of claim 7, further comprising:

a n-channel transistor connected between the n-well diffusion region of the first p-channel transistor and the charge drawing circuit, a gate of the n-channel transistor receiving the supply voltage internal to the semiconductor integrated circuit.

9. The input/output circuit of claim 7, wherein the charge drawing circuit further comprises:

a second p-channel transistor connected between the power supply node and the first node and receiving a voltage at the first node at its gate, the absolute of the threshold of the second p-channel transistor being greater than the threshold of the first n-channel transistor.

10. The input/output circuit of claim 9, wherein the charge drawing circuit further comprises:

a third p-channel transistor connected between the power supply node and the second p-channel transistor, the third p-channel transistor being turned ON when the input/output circuit outputs the signal from the internal circuit to the input/output pad and otherwise turned OFF.

11. An input/output circuit for outputting a signal from an internal circuit of a semiconductor integrated circuit to an input/output pad of the semiconductor integrated circuit, comprising:

a first n-channel transistor connected between a ground node receiving a ground voltage and the input/output pad, a gate of the first n-channel transistor receiving a signal from an internal circuit of the semiconductor integrated circuit directly or indirectly; and a charge drawing circuit for drawing a charge from a p-well diffusion region of the first n-channel transistor to a power supply node receiving a supply voltage internal to the semiconductor integrated circuit when the input/output circuit outputs the signal from the internal circuit to the input/output pad, wherein the charge drawing circuit comprises:

a first p-channel transistor connected between the p-well diffusion region of the first n-channel transistor and a first node, the first p-channel transistor being turned ON when the input/output circuit outputs the signal from the internal circuit to the input/output pad; and a second p-channel transistor connected between the first node and the power supply node, the second p-channel transistor being turned OFF when the input/output circuit outputs the signal from the internal circuit to the input/output pad.

12. The input/output circuit of claim 11, further comprising:

a p-channel transistor connected between the p-well diffusion region of the first n-channel transistor and the charge drawing circuit, a gate of the p-channel transistor receiving the ground voltage.

13. The input/output circuit of claim 11, wherein the charge drawing circuit further comprises:

a second n-channel transistor connected between the first node and the ground node and receiving a voltage at the first node at its gate, the threshold of the second n-channel transistor being greater than the absolute of the threshold of the first p-channel transistor.

14. The input/output circuit of claim 13, wherein the charge drawing circuit further comprises:

a third n-channel transistor connected between the second n-channel transistor and the ground node, the third n-channel transistor being turned ON when the input/output circuit outputs the signal from the internal circuit to the input/output pad and otherwise turned OFF.

* * * * *